US009620380B1

(12) United States Patent
Dai et al.

(10) Patent No.: US 9,620,380 B1
(45) Date of Patent: Apr. 11, 2017

(54) METHODS FOR FABRICATING INTEGRATED CIRCUITS USING SELF-ALIGNED QUADRUPLE PATTERNING

(71) Applicant: GLOBALFOUNDRIES, Inc., Grand Cayman (KY)

(72) Inventors: Xintuo Dai, Malta, NY (US); Huang Liu, Malta, NY (US); Jin Ping Liu, Malta, NY (US); Jiong Li, Malta, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/972,804

(22) Filed: Dec. 17, 2015

(51) Int. Cl.
*H01L 21/308* (2006.01)
*H01L 29/66* (2006.01)
*H01L 21/306* (2006.01)
*H01L 21/3213* (2006.01)
*H01L 21/033* (2006.01)
*H01L 27/108* (2006.01)

(52) U.S. Cl.
CPC ...... *H01L 21/3088* (2013.01); *H01L 21/0337* (2013.01); *H01L 21/0338* (2013.01); *H01L 21/3085* (2013.01); *H01L 21/3086* (2013.01); *H01L 21/30604* (2013.01); *H01L 21/32139* (2013.01); *H01L 27/10826* (2013.01); *H01L 29/6656* (2013.01); *H01L 29/66795* (2013.01)

(58) Field of Classification Search
None
See application file for complete search history.

(56) References Cited

U.S. PATENT DOCUMENTS

2008/0122125 A1* 5/2008 Zhou ................... H01L 21/3088
257/797
2015/0041958 A1* 2/2015 Cheng ................. H01L 27/0886
257/618

\* cited by examiner

*Primary Examiner* — Jiong-Ping Lu
(74) *Attorney, Agent, or Firm* — Lorenz & Kopf, LLP

(57) ABSTRACT

A method for fabricating an integrated circuit includes providing an semiconductor wafer includes forming in an upper mandrel layer a first upper mandrel having a first critical dimension and a second upper mandrel having a second critical dimension; forming upper sidewall spacers along sidewalls of the first upper mandrel while leaving the second upper mandrel without sidewall spacers; removing the first upper mandrel from between the upper sidewall spacers; transferring a pattern of the upper sidewall spacers and of the second upper mandrel into a lower mandrel layer to form first lower mandrels according to the pattern of the upper sidewall spacers and a second lower mandrel according to the pattern of the second upper mandrel; and forming lower sidewall spacers along sidewalls of the first and second lower mandrels.

18 Claims, 9 Drawing Sheets

METHODS FOR FABRICATING INTEGRATED CIRCUITS USING SELF-ALIGNED QUADRUPLE PATTERNING

TECHNICAL FIELD

The technical field generally relates to methods for fabricating integrated circuits, and more particularly relates to methods for fabricating integrated circuits using self-aligned quadruple patterning to form variably spaced structures.

BACKGROUND

Fin-type field effect transistors (FinFETs) have emerged as an effective approach to support the scaling of integrated circuits, as FinFETs require less area than planar transistors. FinFETs utilize fin structures of semiconductor material that function as channels for the FinFETs. Fin structures may be formed in logic areas and memory areas on a semiconductor substrate through general semiconductor patterning processes.

The continued scaling of integrated circuits has generated a demand for methods for forming nanometer-sized features, such as fin structures, that are separated by nanometer-sized distances. As the limits of optical resolution are approached in current lithography processes, double patterning processes have been used to create critical dimensions (CD) and spaces that are beyond the capability of a single lithography step. Specifically, while a conventional lithographic process can be used to form a line-width equal to a minimum critical dimension associated with the lithographic process, a double patterning process can be used to form a line-width smaller than the minimum critical dimension. Double patterning techniques include "pitch split" (also called litho-etch litho-etch, or LELE) and self-aligned double patterning (SADP), also called sidewall image transfer (SIT).

To obtain even smaller feature sizes, self-aligned quadruple patterning (SAQP) or double SIT techniques have been proposed for planar transistors. In some implementations, however, the use of self-aligned quadruple patterning to form fin structures is problematic because only a uniform-pitch layout can currently be achieved. That is, when using SAQP, each fin is spaced apart from each adjacent fin by the same distance. However, while fin structures in a logic area and fin structures in an NMOS portion of an SRAM may be formed with a uniform pitch, and thus current SAQP techniques are suitable, fin structures in a PMOS portion of an SRAM typically require a different pitch or pitches. In other words, if a single fin structure formation process is used to form the fin structures on a semiconductor substrate, the process may be required to form variably spaced fin structures, which current SAQP procedures cannot achieve.

Accordingly, it is desirable to provide methods for fabricating integrated circuits that provide for variably spaced structures. In addition, it is desirable to provide methods for fabricating integrated circuits that use self-aligned quadruple patterning processes to form variably spaced semiconductor fin structures. Furthermore, other desirable features and characteristics will become apparent from the subsequent detailed description and the appended claims, taken in conjunction with the accompanying drawings and the foregoing technical field and background.

BRIEF SUMMARY

Methods for fabricating integrated circuits are provided. In an exemplary embodiment, a method for fabricating an integrated circuit includes, in a semiconductor wafer including a semiconductor substrate, a lower mandrel layer overlying the semiconductor substrate, and an upper mandrel layer overlying the lower mandrel layer, forming in the upper mandrel layer a first upper mandrel having a first critical dimension and a second upper mandrel having a second critical dimension. The first critical dimension is different than the second critical dimension. The method further includes forming upper sidewall spacers along sidewalls of the first upper mandrel while leaving the second upper mandrel without sidewall spacers, removing the first upper mandrel from between the upper sidewall spacers, transferring a pattern of the upper sidewall spacers and of the second upper mandrel into the lower mandrel layer to form first lower mandrels according to the pattern of the upper sidewall spacers and a second lower mandrel according to the pattern of the second upper mandrel, and forming lower sidewall spacers along sidewalls of the first and second lower mandrels.

In another exemplary embodiment, a method for fabricating a FinFET integrated circuit includes providing a semiconductor wafer including a semiconductor substrate, a lower mandrel layer overlying the semiconductor substrate, and an upper mandrel layer overlying the lower mandrel layer and forming in the upper mandrel layer at a first area of the semiconductor wafer a first upper mandrel having a first critical dimension and at a second area of the semiconductor wafer a second upper mandrel having a second critical dimension. The first critical dimension is different than the second critical dimension and the first area is separate and apart from the second area on the semiconductor wafer. The method further includes forming a first sidewall spacer forming layer over the first and second upper mandrels and along sidewalls of the first and second upper mandrels and removing the first sidewall spacer forming layer from over both of the first and second upper mandrels and from along sidewalls of the second upper mandrel. The first sidewall spacer forming layer along sidewalls of the first upper mandrel remain in place, thus forming upper sidewall spacers along sidewalls of the first upper mandrel. Still further, the method includes removing the first upper mandrel from between the upper sidewall spacers while leaving the second upper mandrel in place, transferring a pattern of the upper sidewall spacers and of the second upper mandrel into the lower mandrel layer to form first lower mandrels according to the pattern of the upper sidewall spacers and a second lower mandrel according to the pattern of the second upper mandrel, forming a second sidewall spacer forming layer over the first and second lower mandrels and along sidewalls of the first and second lower mandrels, removing the second sidewall spacer forming layer from over both of the first and second lower mandrels, thus forming lower sidewall spacers along sidewalls of the first and second lower mandrels, removing the first and second lower mandrels while leaving the lower sidewall spacers in place, and transferring a pattern of the lower sidewall spacers into the semiconductor substrate for forming a plurality of fins based on the pattern of the lower sidewall spacers, wherein forming the plurality of fins includes forming fins having at least two different pitches. The fins of a first pitch are in the first area and fins of a second pitch are in the second area. Even still further, the method includes forming the FinFET integrated circuit structure using the fins having at least two different pitches.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

Embodiments of methods for fabricating integrated circuits using self-aligned quadruple patterning and for forming masks for fabricating integrated circuits will hereinafter be described in conjunction with the following drawing figures, wherein like numerals denote like elements, and wherein.

DETAILED DESCRIPTION

The following detailed description is merely exemplary in nature and is not intended to limit the methods for fabricating integrated circuits using self-aligned quadruple patterning or methods for forming masks for fabricating integrated circuits as claimed herein. Furthermore, there is no intention to be bound by any expressed or implied theory presented in the preceding technical field, background or brief summary, or in the following detailed description.

In accordance with the various embodiments herein, methods for fabricating integrated circuits using self-aligned quadruple patterning techniques and methods for forming masks for fabricating integrated circuits using self-aligned quadruple patterning techniques are provided. The methods described herein provide for forming variably spaced fin structures at reduced feature sizes. Further, the methods allow for forming fin structures in logic areas and in memory areas of an integrated circuit using self-aligned quadruple patterning techniques.

FIGS. 1-19 illustrate steps in accordance with an embodiment of a method for fabricating an integrated circuit. Various steps in the design and composition of integrated circuits are well known and so, in the interest of brevity, many conventional steps will only be mentioned briefly herein or will be omitted entirely without providing the known process details. Further, it is noted that integrated circuits include a varying number of components and that single components shown in the illustrations may be representative of multiple components.

Figure 1:
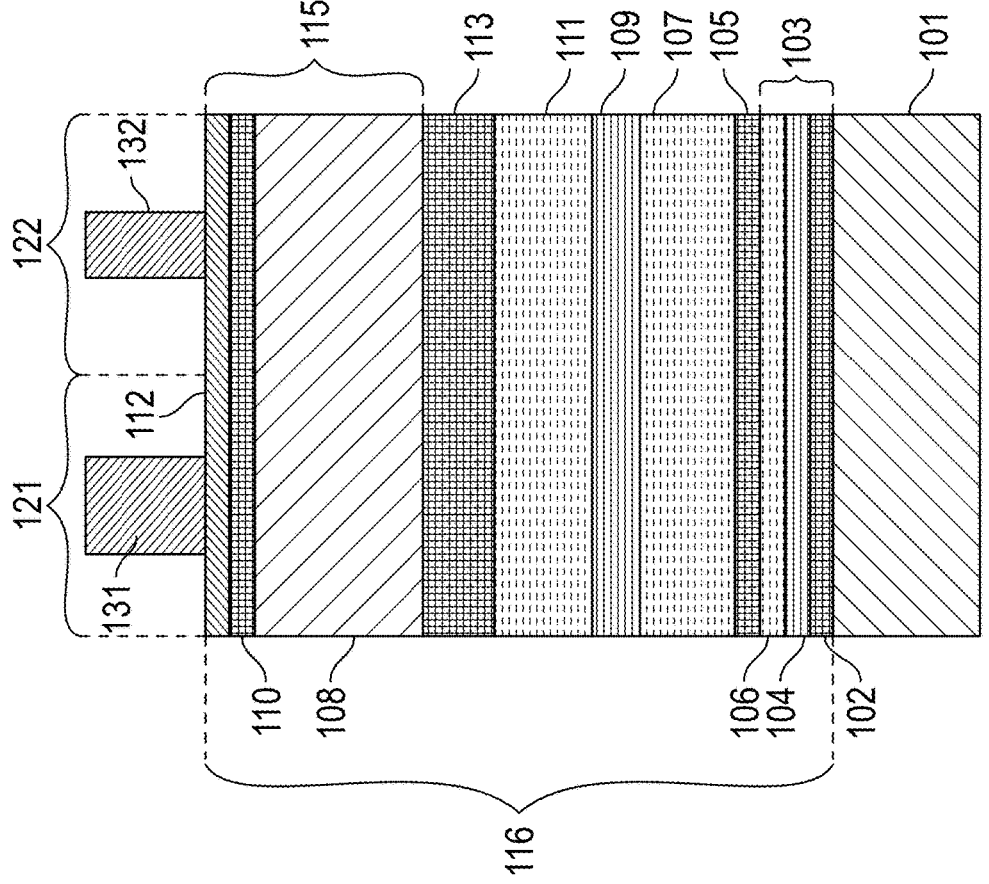

In the exemplary embodiment of FIG. 1, a method for fabricating an integrated circuit includes providing a semiconductor wafer 100 having various material layers formed thereon. At the base of the semiconductor wafer 100 may be a semiconductor substrate 101. An exemplary semiconductor substrate 101 is formed from semiconductor material such as silicon, including the relatively pure silicon materials typically used in the semiconductor industry as well as silicon admixed with other elements, such as germanium and the like. Alternatively, the semiconductor substrate 101 can be realized as germanium, gallium arsenide, and the like, or the semiconductor substrate 101 can include layers of different semiconductor materials. In an exemplary embodiment the semiconductor substrate 101 is realized as a bulk silicon substrate; however, it may be realized as a silicon-on-insulator (SOI) substrate. Thus, it should be understood that providing the semiconductor wafer 100 includes providing the semiconductor wafer 100 including a bulk silicon or a silicon-on-insulator material as the semiconductor substrate 101.

As shown, a lower pattern transfer layer 103 is formed overlying the semiconductor substrate 101. As used herein "overlying" means "on" and "over". In this regard, the lower pattern transfer layer 103 may lie directly on the semiconductor substrate 101 such that it makes physical contact with the semiconductor substrate 101 or it may lie over the semiconductor substrate 101 such that another material layer (not illustrated) is interposed between the semiconductor substrate 101 and the lower pattern transfer layer 103. Further, as used herein "overlying", "over", "upper", and "lower" describe the orientation and/or location of a feature or element within the consistent but arbitrary frame of reference illustrated by the drawings.

In an exemplary embodiment, the lower pattern transfer layer 103 may include one, two, three, or many individual layers of materials. Exemplary materials that may be used for one or more of these layer(s) include nitrides of silicon, oxides of silicon, pure or doped silicon in various crystallographic states, such as bulk, amorphous, polycrystalline, and combinations thereof. As illustrated in the embodiment of FIG. 1, a layer 102 of silicon nitride overlies and is in contact with the semiconductor substrate 101, a layer 104 of silicon oxide overlies and is in contact with the layer 102, and a layer 106 of amorphous silicon overlies and is in contact with the layer 104. Thus, the lower pattern transfer layer in the example of FIG. 1 is composed of three separate layers: layer 102, layer 104, and layer 106. In an exemplary embodiment, the lower pattern transfer layer 103 is blanket-deposited by a plasma-enhanced chemical vapor deposition (PECVD) process, a low pressure chemical vapor deposition (LPCVD), or another chemical vapor deposition (CVD) process. In an exemplary embodiment, the lower pattern transfer layer 103 has a thickness (a combined thickness if two or more separate layers form the layer 103) of about 80 nanometers (nm) to about 120 nm.

An exemplary lower hardmask layer 105 may be formed overlying the lower pattern transfer layer 103. The exemplary lower hard mask layer 105 is deposited silicon nitride, silicon oxide, silicon oxynitride, amorphous carbon, a carbon-doped silica (SiCOH), or another material suitable for the patterning steps of the process. In the illustrated example, the lower hardmask layer 105 is a silicon nitride. In an exemplary embodiment, the lower hard mask layer 105 is formed by blanket-deposition using, for example, a plasma-enhanced chemical vapor deposition process, a low pressure chemical vapor deposition, or another chemical vapor deposition process. The exemplary lower hard mask layer 105 has a thickness of about 25 nm to about 50 nm.

As shown, a lower mandrel layer 107 is formed overlying the lower hard mask layer 105. The lower mandrel layer 107 is amorphous silicon, polycrystalline silicon, or another material suitable for use in required patterning steps. In an exemplary embodiment, the lower mandrel layer 107 is blanket-deposited by a plasma-enhanced chemical vapor deposition (PECVD) process, a low pressure chemical vapor deposition (LPCVD), or another chemical vapor deposition (CVD) process. An exemplary lower mandrel layer 107 has a thickness of about 80 nanometers (nm) to about 120 nm. Thus, it should be understood that providing the semiconductor wafer 100 includes providing the semiconductor wafer 100 including an amorphous silicon lower mandrel layer 107.

As further shown in FIG. 1, the semiconductor wafer 100 includes an exemplary upper hardmask layer 109 formed overlying the lower mandrel layer 107. The exemplary upper hard mask layer 109 is deposited silicon nitride, silicon oxide, silicon oxynitride, amorphous carbon, a carbon-doped silica (SiCOH), or another material suitable for the patterning steps of the process. In the illustrated example, the upper hardmask layer 109 is silicon oxide. In an exemplary embodiment, the upper hard mask layer 109 is formed by blanket-deposition using, for example, a plasma-enhanced chemical vapor deposition process, a low pressure chemical vapor deposition, or another chemical vapor deposition process. The exemplary upper hard mask layer 109 has a thickness of about 25 nm to about 50 nm.

An exemplary upper pattern transfer layer 111 is formed overlying the upper hard mask layer 109. The upper pattern transfer layer 111 may include one, two, three, or many individual layers of materials. Exemplary materials that may be used for one or more of these layer(s) include nitrides of silicon, oxides of silicon, pure or doped silicon in various crystallographic states, such as bulk, amorphous, polycrystalline, and combinations thereof. As illustrated in the embodiment of FIG. 1, the upper pattern transfer layer 111 is a single layer of amorphous silicon. In an exemplary embodiment, the upper pattern transfer layer 111 is blanket-deposited by a plasma-enhanced chemical vapor deposition (PECVD) process, a low pressure chemical vapor deposition (LPCVD), or another chemical vapor deposition (CVD) process. In an exemplary embodiment, the upper pattern transfer layer 111 has a thickness (a combined thickness if two or more separate layers form the layer 111) of about 80 nanometers (nm) to about 120 nm.

As shown, an upper mandrel layer 113 is formed overlying the upper pattern transfer layer 111. In an exemplary embodiment, the upper mandrel layer 113 is silicon nitride, or another material suitable for use in lithography steps. In an exemplary embodiment, the upper mandrel layer 113 is blanket-deposited by a plasma-enhanced chemical vapor deposition process, a low pressure chemical vapor deposition, or another chemical vapor deposition process. An exemplary upper mandrel layer 113 has a thickness of about 80 nm to about 120 nm, such as about 100 nm. Thus, it should be understood that providing the semiconductor wafer 100 includes providing the semiconductor wafer 100 including the amorphous silicon upper mandrel layer 113.

An exemplary capping layer 115 is formed overlying the upper mandrel layer 113 and is deposited silicon nitride, silicon oxide, silicon oxynitride, amorphous carbon, silica, a carbon-doped silica (SiCOH), an anti-reflective coating (ARC), or another material suitable for the lithography steps of the process. An exemplary capping layer 115 is formed by blanket-deposition using, for example, a plasma-enhanced chemical vapor deposition process, a low pressure chemical vapor deposition, or another chemical vapor deposition process. One, two, three, or more layers of materials may form the capping layer 115. For example, in the illustrated embodiment of FIG. 1, the capping layer 115 is composed of a layer of silica 108, a layer of silicon oxynitride 110, and a layer of an ARC material 112. An exemplary capping layer 115 has a thickness (a combined thickness if two or more separate layers form the layer 115) of about 25 nm to about 50 nm, such as about 40 nm.

The lower pattern transfer layer 103, the lower hardmask layer 105, the lower mandrel layer 107, the upper hardmask layer 109, the upper pattern transfer layer 111, the upper mandrel layer 113, and the capping layer may be consider to form a mask stack 116. The mask stack 116 may include other layers, such as anti-reflective coating layers, etch stop layers, optical dispersive layers, or other desired layers interposed below or over any of the foregoing mentioned layers. The mask stack 116 lies over the semiconductor substrate 101 and is processed to form a mask for patterning the semiconductor substrate 101 as described herein.

The mask stack 116 may be considered to include two areas, a first area 121 and a second area 122, as shown in FIG. 1. For purposes of the described patterning process, a photoresist material is formed using a first pattern 131 in the first area 121 overlying the capping layer 115, and the photoresist material is formed using a second pattern 132 in the second area 122 overlying the capping layer 115. The first and second patterns 131, 132 may be the same or different. For simplicity of illustration, in FIG. 1, the first pattern 131 is shown having a greater width than the second pattern 132. The photoresist material is deposited and patterned using known photolithographic patterning and etching processes to form the first and second patterns 131, 132. Thus, the first and second patterns 131, 132 selectively cover portions of the capping layer 115 in their respective first and second areas 121, 122. Accordingly, the procedure described above in connection with FIG. 1 may be characterized as providing, receiving, or otherwise gaining access to the semiconductor wafer 100 including the semiconductor substrate 101, the lower mandrel layer 107 overlying the semiconductor substrate 101, and the upper mandrel layer 113 overlying the lower mandrel layer 107. Moreover, FIG. 1 may also be characterized as providing the semiconductor wafer 100 with the capping layer 115 overlying the upper mandrel layer 113.

Figure 2:
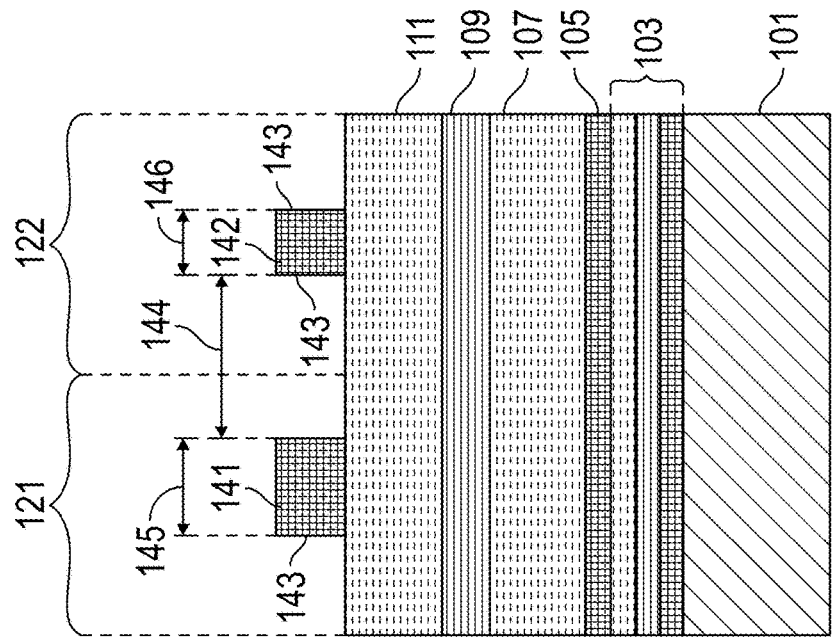
FIGS. 1-19 illustrate, in cross section, a portion of an integrated circuit and method steps for fabricating the integrated circuit with a self-aligned quadruple patterning process in accordance with various embodiments herein.

Referring now to FIG. 2, an etch process is performed to etch through the capping layer 115 and into the upper mandrel layer 113 to form first and second upper mandrels 141, 142 in respective first and second areas 121, 122, which correspond with the shapes for the first and second patterns 131, 132, respectively. More simply, the patterns 131, 132 of the photoresist material are transferred to the upper mandrel layer 113 via etching. As a result, upper mandrels including the first upper mandrel 141 and the second upper mandrel 142 are formed overlying the upper pattern transfer layer 111. Exemplary upper mandrels 141 and 142 are formed with substantially vertical sidewalls 143. As shown, the first upper mandrel 141 and the second upper mandrel 142 are separated from one another by a distance indicated by double headed arrow 144. Further, the first upper mandrel 141 has a critical dimension indicated by length bar 145 and the second mandrel 142 has a critical dimension indicated by length bar 146. In the exemplary embodiment, the first critical dimension 145 is not equal to the second critical dimension 146. Further, in the exemplary embodiment, the distance 144 is not equal to the first critical dimension 145 or the second critical dimension 146. As described below, providing upper mandrels having varied critical dimensions and separated by non-uniform distances allow for formation of variably spaced structures via self-aligned quadruple patterning. It is noted that a plurality of first upper mandrels 141 and/or second upper mandrels 142 may be formed and separated by uniform or variable distances as desired. For example, first upper mandrels 141 may be formed having uniform critical dimensions 145 and separated by uniform distances. Accordingly, the procedure described above in connection with FIG. 2 may be characterized as forming in the upper mandrel layer 113 at the first area 121 of the semiconductor wafer 100 the first upper mandrel 141 having the first critical dimension 145 and at the second area 122 of the semiconductor wafer 100 the second upper mandrel 142 having the second critical dimension 146, wherein the first critical dimension 145 is different than the second critical dimension 146, and wherein the first area 121 is separate and apart from the second area 122 on the semiconductor wafer (FIG. 1, semiconductor wafer 100, as modified in FIG. 2). It should further be appreciated that this procedure may be characterized as wherein forming the first and second upper mandrels 141, 142 includes etching through the capping layer 115 using a patterned masking layer as an etch mask (first and second patterns 131, 132).

Figure 3:
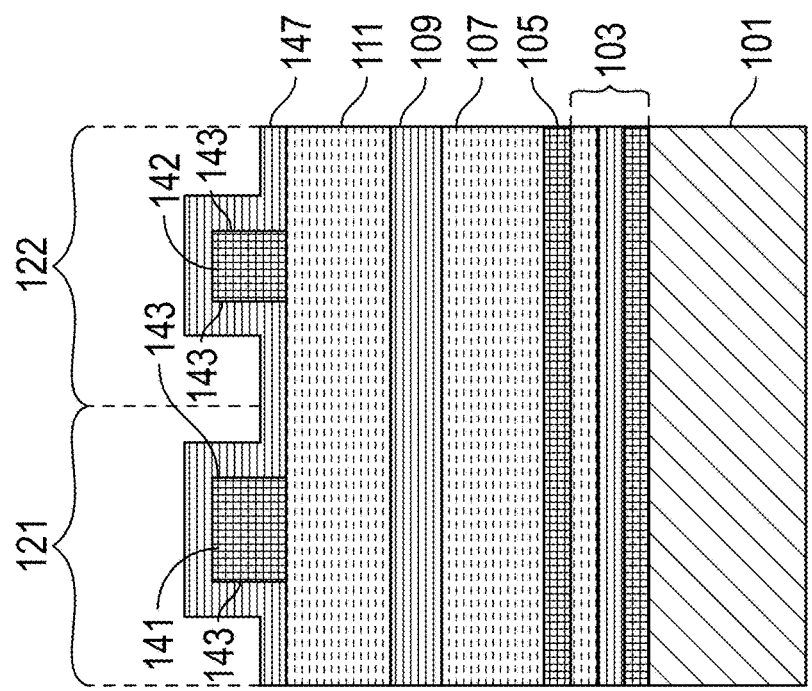

The method may continue in FIG. 3 with the formation of a first sidewall spacer-forming layer 147 over the upper pattern transfer layer 111, the first upper mandrel 141 and the second upper mandrel 142. An exemplary spacer-forming layer 147 is conformally deposited such as by atomic layer deposition (ALD), plasma-enhanced chemical vapor deposition, a low pressure chemical vapor deposition, or another chemical vapor deposition process. An exemplary spacer-forming layer 147 contacts the upper pattern transfer layer 111 and the sidewalls 143 of the upper mandrels 141, 142 and encapsulates the upper mandrels 141, 142. Spacer-forming layer 147 may be formed of silicon nitride, silicon dioxide, or any type of organic or inorganic material having etch selectivity with respect to upper mandrels 141, 142. In the exemplary embodiment shown, the layer 147 is composed of a silicon oxide material. Accordingly, the procedure described above with regard to FIG. 3 may be characterized as forming the first sidewall spacer forming layer 147 over the first and second upper mandrels 141, 142 and along sidewalls 143 of the first and second upper mandrels 141, 142. Moreover, FIG. 3 may be characterized such that forming the first sidewall spacer forming layer 147 includes forming a silicon oxide sidewall spacer forming layer.

Figure 4:
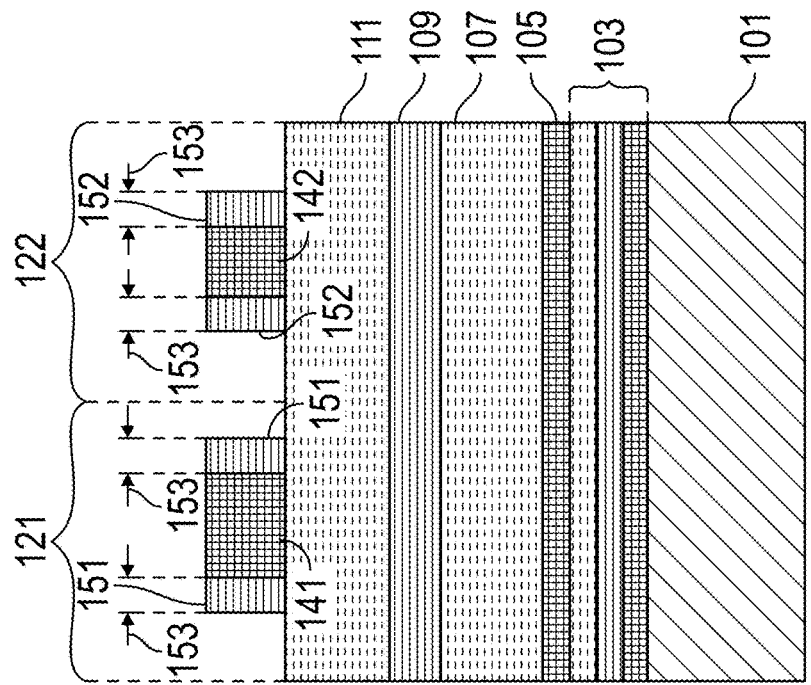

The spacer-forming layer 147 is etched anisotropically to form first upper sidewall spacers 151 in the first area 121 and second upper sidewall spacers 152 in the second area 122, as shown in FIG. 4. An exemplary etch uses an RIE process with chemistries based upon $CHF_3/O_2$ to etch silicon nitride, and $CHF_3$ or $CF_4$ to etch silicon oxynitride or silicon oxide. The first and second upper sidewall spacers 151, 152 are formed with a critical dimension indicated by arrows 153. In an exemplary embodiment, the critical dimension 153 is about 14 nm to about 30 nm. As shown, the first and second upper sidewall spacers 151, 152 surround the first and second upper mandrels 141, 142 respectively. In an exemplary embodiment, an etching process is performed followed by planarization of both upper mandrels 141, 142 and upper sidewall spacers 151, 152.

Figure 5:
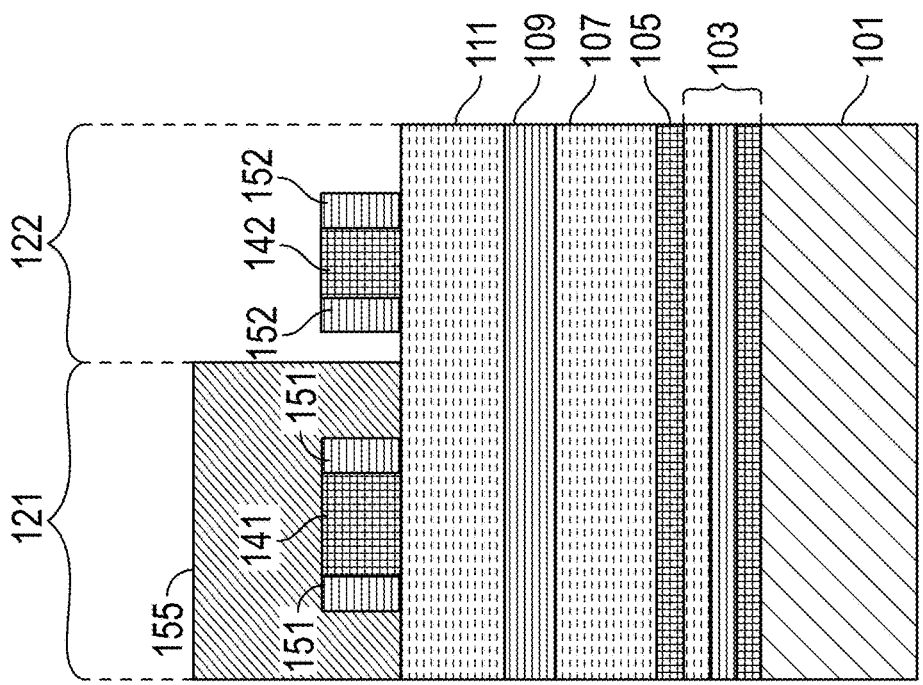

With attention now to FIG. 5, the structures formed in the first area 121, i.e., the first upper sidewall spacers 151 and the first upper mandrel 141, are masked by an appropriate masking material 155, such as a photoresist material. The masking material 155 is not provided in the second area 122, and thus the structures of the second area, i.e., the second upper sidewall spacers 152 and the second upper mandrel 142, remain exposed pursuant to the etching process of FIG. 4. The masking material 155 may be provided in the first area 121 only using a blanket deposition process, followed by patterning and etching to remove the masking material 155 from the second area 122 while leaving the masking material 155 only in the first area 121.

Figure 6:
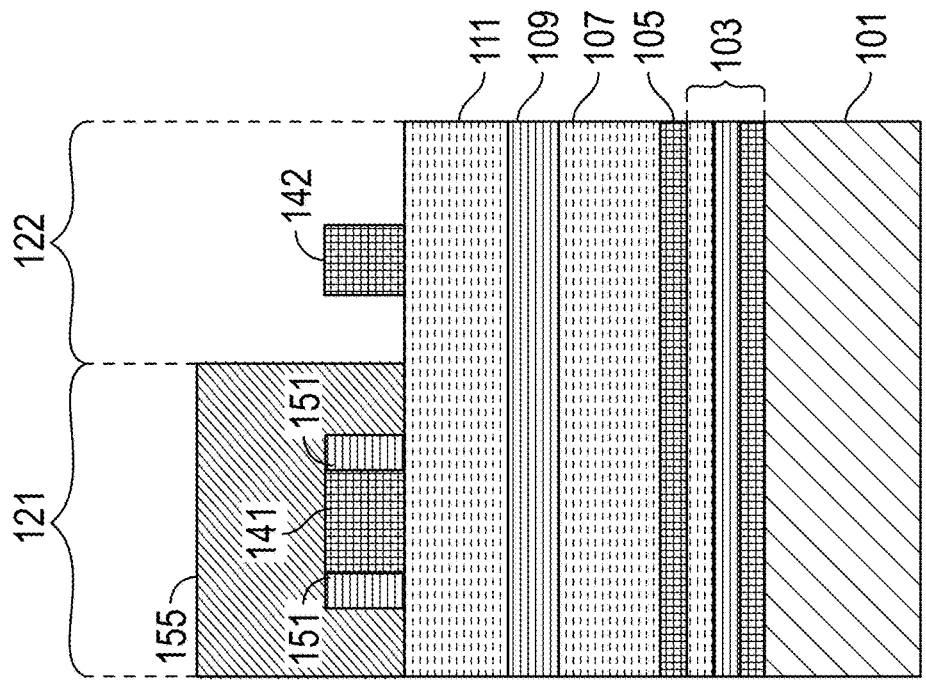
Figure 7:
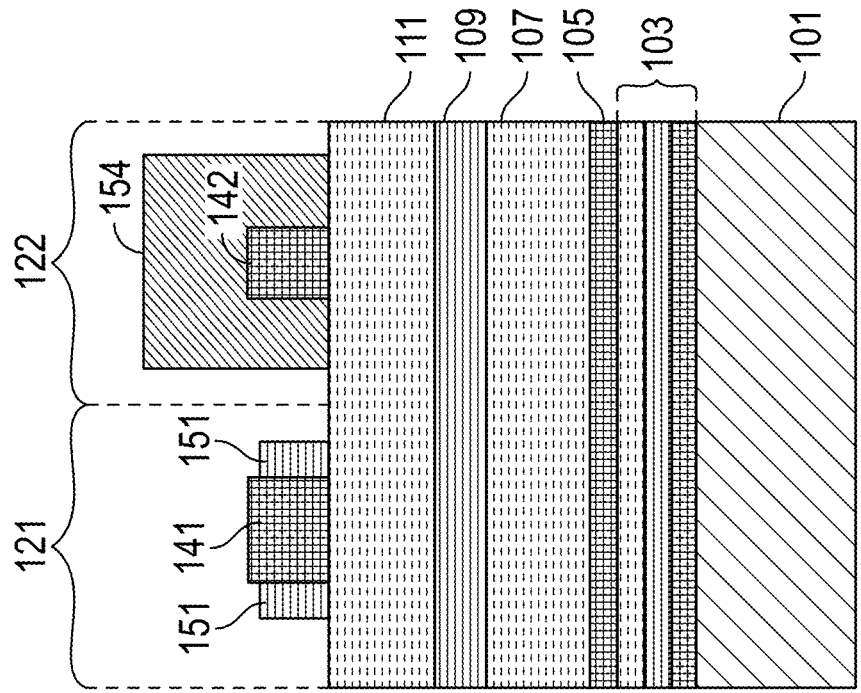

As illustrated in FIG. 6, the second upper sidewall spacers 152 are removed, leaving the second upper mandrel 142 without any sidewall spacers. The second upper sidewall spacers 152 may be removed by any process selective to its material (such as silicon oxide) over the masking material 155 and the upper mandrel material (such as silicon nitride). $CHF_3$ or $CF_4$ based etching chemistries are suitable for this purpose, for example. Thereafter, the masking material 155 may be removed from the first area 121 as shown in FIG. 7, leaving the first upper mandrel 141 provided with its upper sidewall spacers 152, and the second upper mandrel 142 provided with no sidewall spacers. Removal of the masking material, such as a photoresist material, may be accomplished using conventional techniques such as various chemical stripping processes. Accordingly, the procedures described above with reference to FIGS. 4-7 of the exemplary method may be characterized as removing the first sidewall spacer forming layer 147 from over both of the first and second upper mandrels 141, 142 and from along sidewalls 143 of the second upper mandrel 142, wherein the first sidewall spacer forming layer 147 along sidewalls 143 of the first upper mandrel 141 remain in place, thus forming upper sidewall spacers 151 along sidewalls 143 of the first upper mandrel 141. More particularly, the procedures described above with regard to FIGS. 3-7 may be characterized as forming upper sidewall spacers 151 along sidewalls 143 of the first upper mandrel 141 while leaving the second upper mandrel 142 without sidewall spacers. Alternatively or additionally, the procedures may be characterized as forming upper sidewall spacers 151 along sidewalls 143 of the first upper mandrel 141 including forming upper sidewall spacers 151 along sidewalls 143 of both the first and second upper mandrels 141, 142 and thereafter removing the upper sidewall spacers 152 along sidewalls of the second upper mandrel 142. In this regard, removing the upper sidewall spacers 152 along sidewalls of the second upper mandrel 142 includes masking (mask 155) the first upper mandrel 141 and the sidewall spacers 151 along sidewalls 143 of the first upper mandrel 141.

Figure 8:
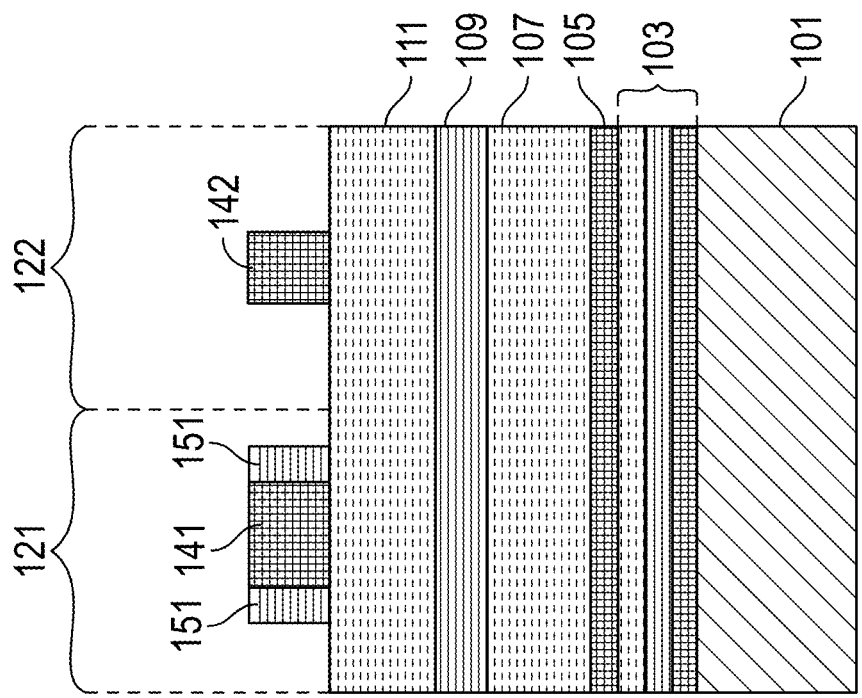

With reference now to FIG. 8, the structure formed in the second area 122, i.e., the second upper mandrel 142, is masked by an appropriate masking material 156, such as a photoresist material. In an exemplary embodiment, the masking material 156 is not provided in the first area 121, and thus the structures of the first area, i.e., the first upper sidewall spacers 151 and the first upper mandrel 141 remain exposed. The masking material 156 may be provided in the second area 122 only using a blanket deposition process, followed by patterning and etching to remove the masking material 156 from the first area 121 while leaving the masking material 156 only in the second area 122.

Figure 9:
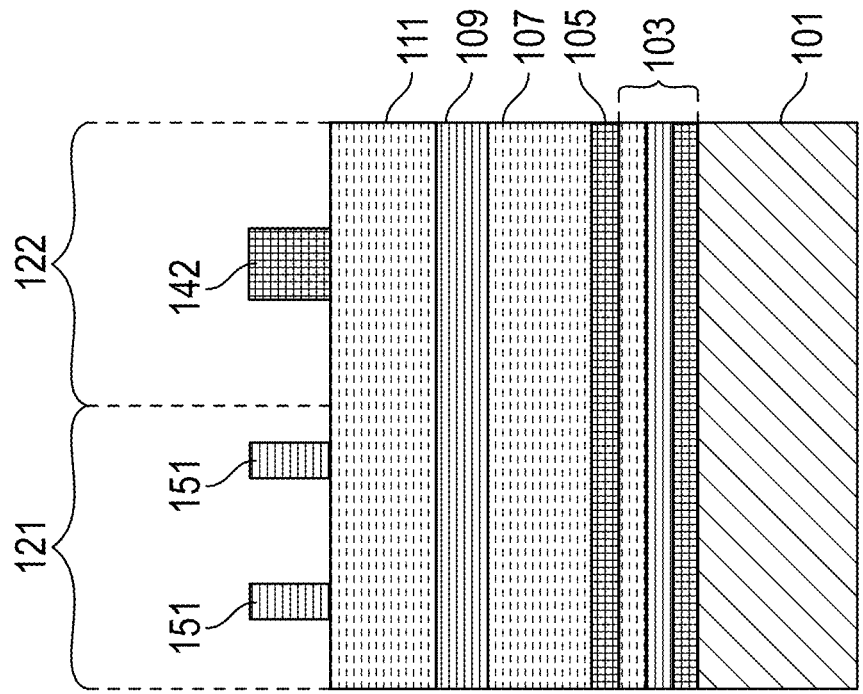
Figure 10:
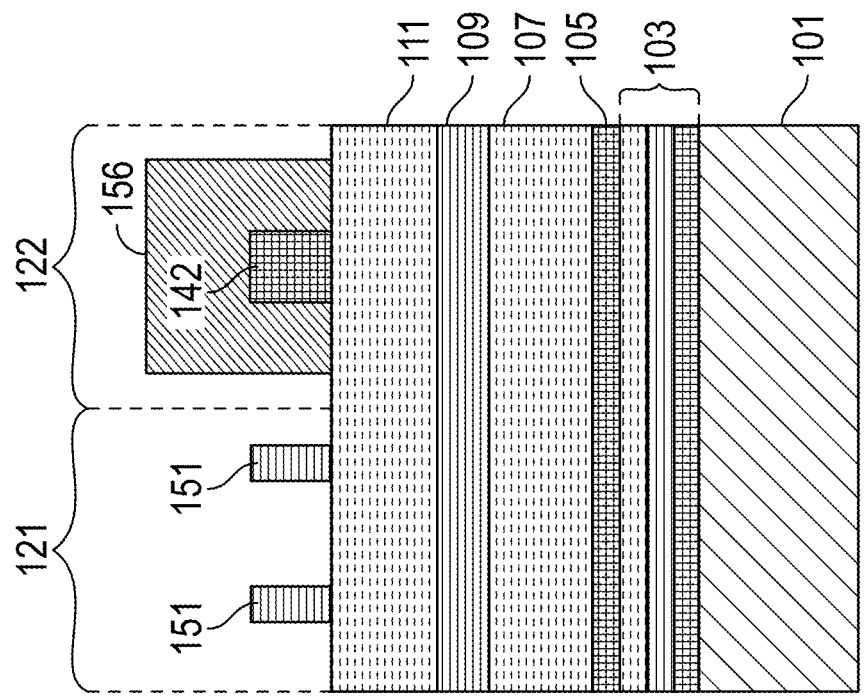
Figure 12:
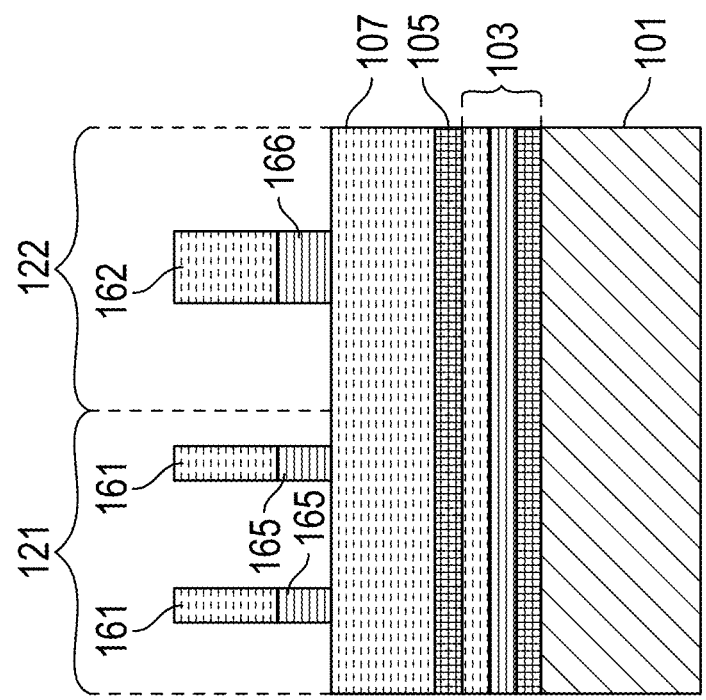

As illustrated in FIG. 9, the first upper mandrel 141 is removed, leaving the first upper sidewall spacers 151 on the upper pattern transfer layer 111. In an exemplary embodiment, the first upper mandrel 141 is removed by a reactive ion etch selective to the first upper mandrel 141 in relation to the first upper sidewall spacers 151 and the masking layer 156. RIE processes with chemistries based upon $CHF_3/O_2$ to etch silicon nitride are thus suitable for this purpose. Thereafter, the masking material 156 may be removed from the second area 122 as shown in FIG. 10, leaving the first upper sidewall spacers 151 provided with no mandrel therebetween, and the second upper mandrel 142 provided with no sidewall spacers. Removal of the masking material, such as a photoresist material, may be accomplished using conventional techniques such as various chemical stripping processes. Thus, the procedure described above of with regard to FIG. 9 may be characterized as removing the first upper mandrel 141 from between the first upper sidewall spacers 151 while leaving the second upper mandrel 142 in place. It should also be appreciate that removing the first upper mandrel 141 includes masking (with masking layer 156) the second upper mandrel 142.

Figure 11:
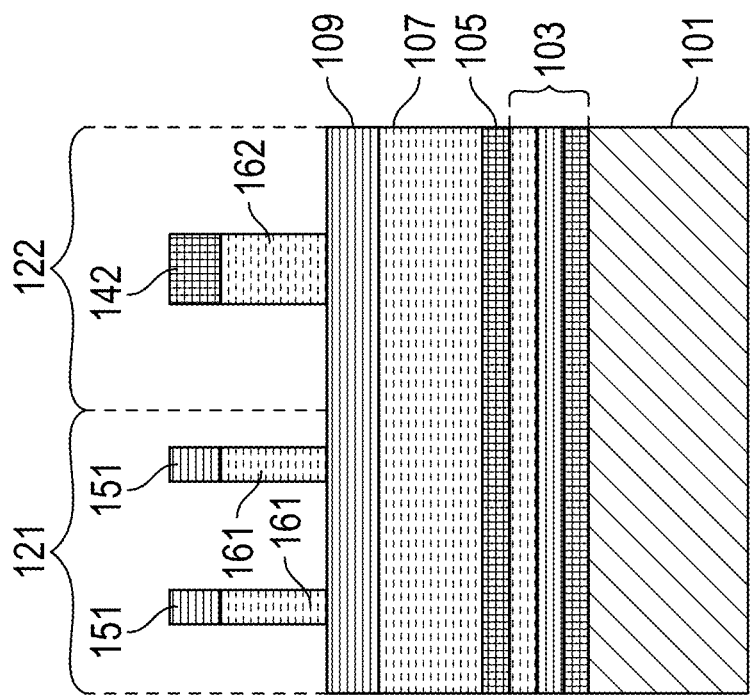

Then, with reference to FIG. 11, in an exemplary embodiment, the exposed portions of the upper pattern transfer layer 111, i.e., those portions not directly underlying the first upper sidewall spacers 151 or the second upper mandrel 142, are etched. For example, an anisotropic etch may be performed by a timed reactive ion etch process selective to the upper pattern transfer layer 111. As a result, the patterns of the first upper sidewall spacers 151 in the first area 121 and the second upper mandrel in the second area are transferred into the upper pattern transfer layer 111, with at least a portion of the first upper sidewall spacers 151 and the second upper mandrel 142 remaining there-atop, as first upper pattern transfer structures 161 and second upper pattern transfer structure 162, respectively. Continuing with FIG. 12, the pattern may be continued into the upper hardmask layer underlying the first and second upper pattern transfer structures 161, 162, such that the first upper pattern transfer structures 161 overlie first upper hardmask portions 165 and the second upper pattern transfer structure 162 overlies a second upper hardmask portion 166, the first upper hardmask portions 165 having width corresponding to the first upper pattern transfer structures 161 and the second upper hardmask portion 166 having a width corresponding to the second upper pattern transfer structure 162. Portions of the lower mandrel layer 107 not underlying the first and second portions 165, 166 of the upper hardmask layer are thus exposed. In this process, any remaining portions of the first upper sidewall spacers 151 and the second upper mandrel 142 are removed as well. Suitable etchants for this step are those selective to the upper hardmask material, e.g., a silicon oxide, as described above.

Figure 14:
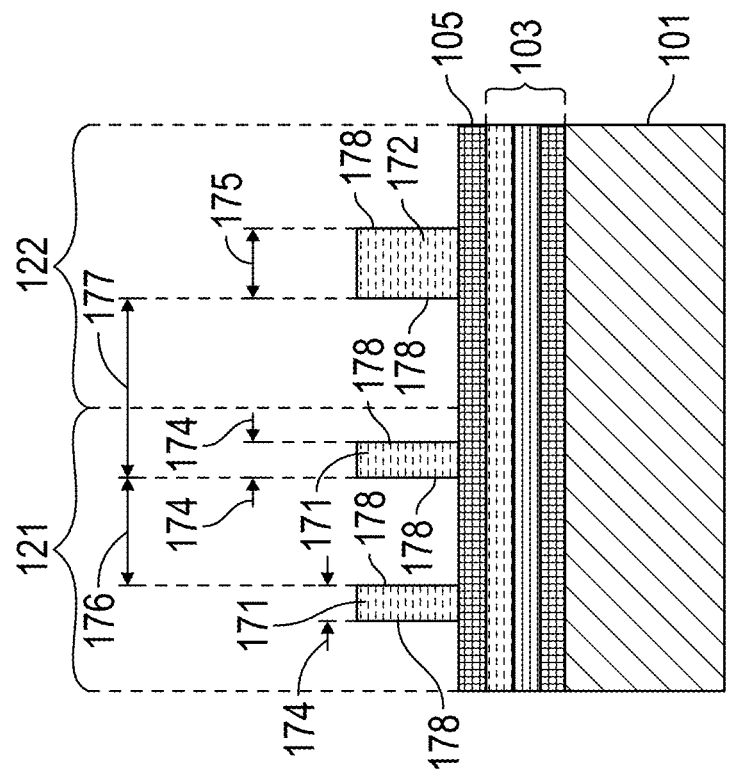
Figure 13:
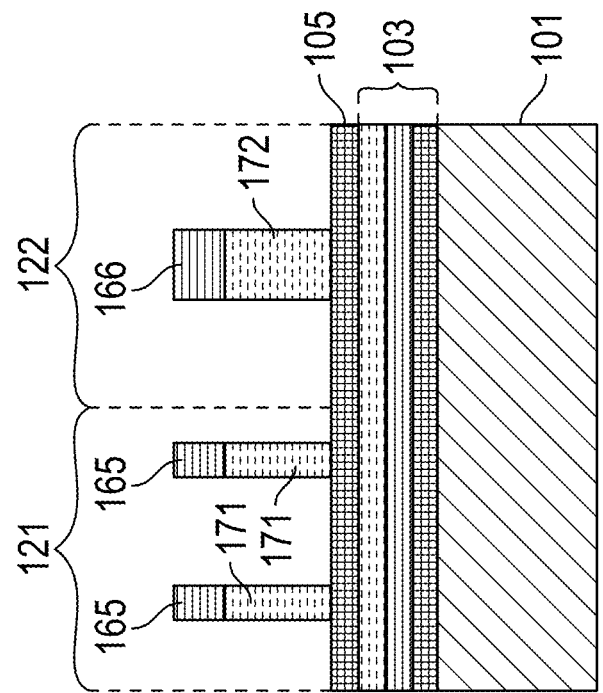

The first and second upper pattern transfer structures 161, 162, and the first and second portions of the upper hardmask layer 165, 166, are used, as shown in FIGS. 13 and 14, to transfer their respective patterns into the lower mandrel layer 107. For example, in FIG. 13, an etchant selective to the lower mandrel layer 107 is used. In an exemplary embodiment, where as in FIG. 1 et seq., the material of the upper pattern transfer layer 111 and the lower mandrel layer 107 are the same, such as amorphous silicon, and the etching process will also remove the first and second upper pattern transfer structures 161, 162, while leaving the first and second portions of the upper hardmask layer 165, 166 to act as etch blocks in the etching of the lower mandrel layer 107. Thus, as shown in FIG. 13, this etching process results in the formation of first lower mandrels 171 according to the pattern of the first upper pattern transfer structures 161 (and the first portion of the upper hardmask layer 165, which does remain thereover) and a second lower mandrel 171 according to the pattern of the second upper pattern transfer structure 162 (and the second portion of the upper hardmask layer 166, which does remain thereof), as well as exposure of the lower hardmask layer 105 in areas not directly below a respective first or second lower mandrel 171, 172. A further etching process, as shown in FIG. 14, selective to the remaining portions of the upper hardmask layer 165, 166, as described above, for example, with respect to silicon oxides, is performed to remove the portions 165, 166, from over the first lower mandrels 171 and the second lower mandrel 172. Thus, transferring the pattern of the first upper sidewall spacers 151 and of the second upper mandrel 142 includes transferring the pattern through the upper pattern transfer layer 111 and/or the upper hardmask layer 109.

As a result, first and second lower mandrels 171, 172 are formed from the lower mandrel layer 107 overlying the lower hard mask layer 105. As shown, the first and second lower mandrels 171, 172 have a non-uniform critical dimension, indicated by arrows 174 and 175, respectively, equal to or less than the critical dimension of the upper sidewall spacers 153 and of the second upper mandrel 146, respectively. Further, the first lower mandrels 171 are separated from one another by a distance indicated by double-headed arrow 176, and the second lower mandrel 172 is separated from the first lower mandrels 171 by a distance indicated by double-headed arrow 177. Distance 176 is equal to or less than the critical dimension 145 of the first upper mandrel 141 and distance 177 is equal to or less than the distance 144 less the spacer critical dimension 153. In the exemplary embodiment, distances 176 and 177 are not equal, though in other embodiments they may be equal. As shown, the first and second lower mandrels 171, 172 are formed with substantially vertical sidewalls 178. Accordingly, the procedures described above with regard to FIGS. 10-14 may be characterized as transferring a pattern of the upper sidewall spacers 151 and of the second upper mandrel 142 into the lower mandrel layer 107 to form first lower mandrels 171 according to the pattern of the upper sidewall spacers 151 and the second lower mandrel 172 according to the pattern of the second upper mandrel 142.

Figure 15:
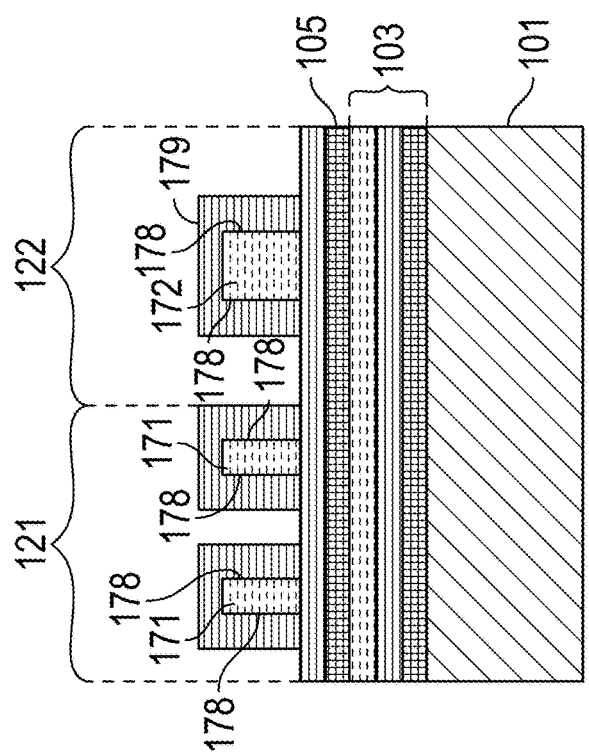

Continuing now to FIG. 15, the method may continue with the formation of a second sidewall spacer-forming layer 179 over the lower hardmask layer 105, the first lower mandrels 171 and the second lower mandrel 172. An exemplary spacer-forming layer 179 is conformally deposited such as by atomic layer deposition (ALD), plasma-enhanced chemical vapor deposition, a low pressure chemical vapor deposition, or another chemical vapor deposition process. An exemplary spacer-forming layer 179 contacts the lower hardmask layer 105 and the sidewalls 178 of the lower mandrels 171, 172 and encapsulates the lower mandrels 171, 172. Spacer-forming layer 179 may be formed of silicon nitride, silicon dioxide, or any type of organic or inorganic material having etch selectivity with respect to lower mandrels 171, 172. In the exemplary embodiment shown, the layer 179 is composed of a silicon oxide material. Accordingly, this step of the exemplary method may with regard to FIG. 15 be characterized as forming the second sidewall spacer forming layer 179 over the first and second lower mandrels 171, 172 and along sidewalls 178 of the first and second lower mandrels 171, 172. Accordingly, with respect to FIG. 15, the exemplary method may be characterized as removing the second sidewall spacer forming layer 179 from over both of the first and second lower mandrels 171, 172, thus forming lower sidewall spacers 181, 182 along sidewalls 178 of the first and second lower mandrels 171, 172. Moreover, this procedure may be characterized such that forming the second sidewall spacer forming layer 179 includes forming a silicon oxide sidewall spacer forming layer.

Figure 16:
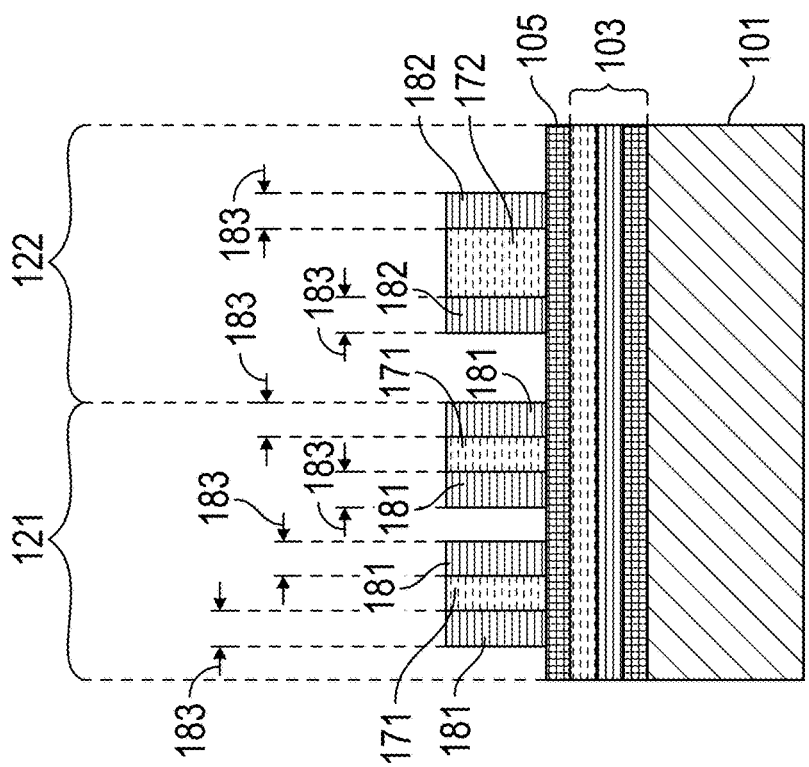

The spacer-forming layer 179 is etched anisotropically to form first lower sidewall spacers 181 in the first area 121 and second lower sidewall spacers 182 in the second area 122, as shown in FIG. 16. An exemplary etch uses an RIE process with chemistries based upon $CHF_3/O_2$ to etch silicon nitride, and $CHF_3$ or $CF_4$ to etch silicon oxynitride or silicon oxide. The first and second lower sidewall spacers 181, 182 are formed with a critical dimension indicated by arrows 183. In an exemplary embodiment, the critical dimension 183 is about 10 nm to about 20 nm. As shown, the first and second lower sidewall spacers 181, 182 surround the first and second lower mandrels 171, 172 respectively. In an exemplary embodiment, an etching process is performed followed by planarization of both lower mandrels 171, 172 and lower sidewall spacers 181, 182. Accordingly, with respect to the procedures described above with regard to FIGS. 15 and 16, the exemplary method of the present disclosure may be characterized as forming lower sidewall spacers 181, 182 along sidewalls 178 of the first and second lower mandrels 171, 172.

Figure 17:
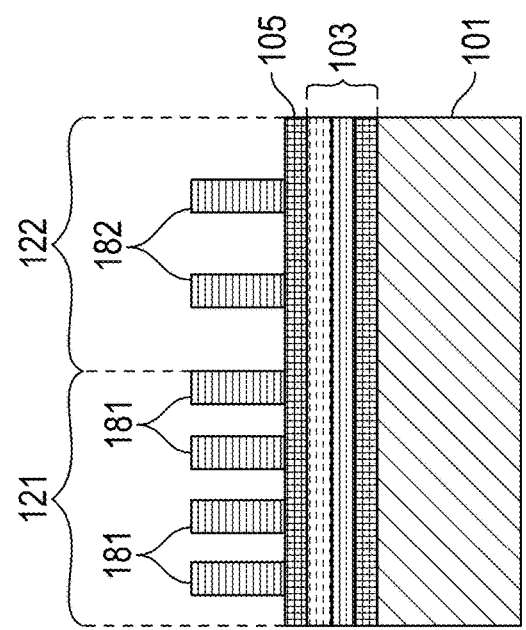

Next, the first and second lower mandrels 171, 172 are removed, leaving the lower sidewall spacers 181 in the first area 121 and the lower sidewall spacers 182 in the second area 122 on the lower hard mask layer 105, as illustrated in FIG. 17. In an exemplary embodiment, the first and second lower mandrels 171, 172 are removed by a reactive ion etch selective to the first and second lower mandrels 171, 172 in relation to the first and second lower sidewall spacers 181, 182 and the lower hard mask layer 105. Accordingly, as shown in FIG. 17, the method may be further characterized as removing the first and second lower mandrels 171, 172 while leaving the lower sidewall spacers 181, 182 in place.

Figure 18:
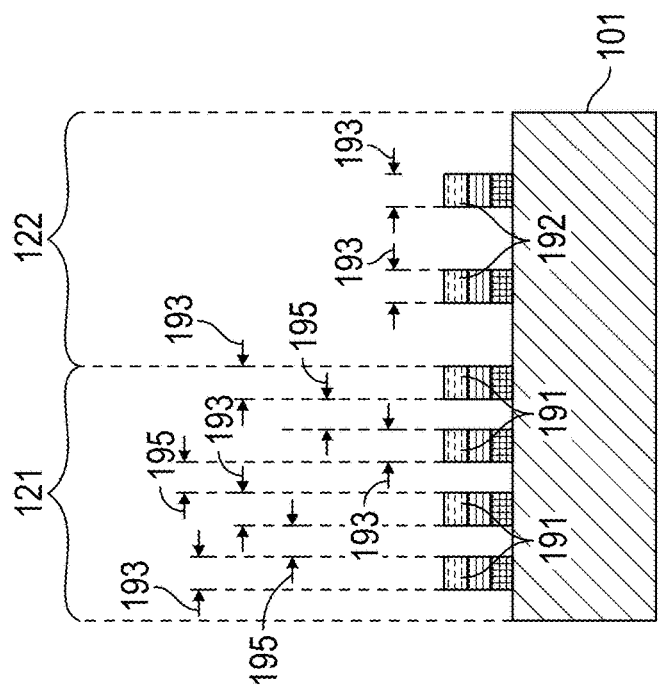
Figure 19:
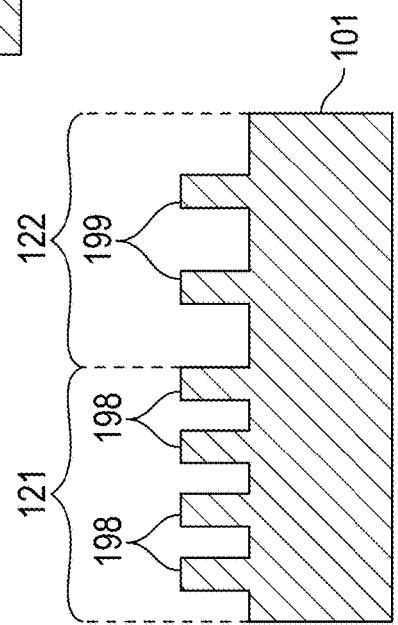

In FIG. 18, the exposed portions of the lower hard mask layer 105 and the lower pattern transfer layer 103, i.e., those portions not directly underlying the first and second lower sidewall spacers 181, 182, are etched. For example, one or more anisotropic etching processes may be performed by a timed reactive ion etch selective to the lower hard mask layer 105 and the lower pattern transfer layer 103. As a result, first lower pattern transfer structures 191 in the first area 121 and second lower pattern transfer structures 192 in the second area 122 are formed over the semiconductor substrate 101. The first and second lower pattern transfer structures 191, 192 are formed with a substantially uniform critical dimension, indicated by arrows 193, equal to or less than the critical dimension 183 of the lower sidewall spacers 181, 182. The first and second lower pattern transfer structures 191, 192 may thereafter be employed to transfer their pattern into the semiconductor substrate as first fins 198 and second fins 199, as shown in FIG. 19. Thus, the first and second lower pattern transfer structures 191, 192 form a completed mask for patterning the semiconductor substrate 101 to fabricate a FinFET integrated circuit. In this regard, any further processing may be performed, including the formation of gates, source/drain regions, stress materials, contacts, and interconnect structures, as is known in integrated circuit fabrication. Accordingly, the method continues with regard to FIGS. 18 and 19 with transferring a pattern of the lower sidewall spacers 181, 182 into the semiconductor substrate 101 for forming a plurality of fins 198, 199 based on the pattern of the lower sidewall spacers 181, 182, wherein forming the plurality of fins 198, 199 includes forming fins having at least two different pitches, wherein fins of a first pitch 198 are in the first area 121 and fins of a second pitch 199 are in the second area 122. More particularly, the method is characterized as transferring the pattern through the lower pattern transfer layer 103 and/or the lower hardmask layer 105.

Thus, based on the pattern transfer from the first and second lower mandrels as shown in FIG. 14, the first lower pattern transfer structures 191 are able to be spaced apart by a distance 195 that may be equal to or less than the critical dimension of the first lower sidewall spacers 181, and the second lower pattern transfer structures 192 are able to be spaced apart by a distance 196 that may be equal to or less than the critical dimension of the second lower mandrel 175. Given the possible differences in these critical dimensions 195, 196, a FinFET structure with variable pitch (FIG. 19), formed using self-aligned quadruple patterning procedures, is achieved. It should therefore be understood that forming the plurality of fins 198, 199 includes forming fins having at least two different pitches. As such, the method may be characterized as forming a FinFET integrated circuit structure using the fins 198, 199 having at least two different pitches.

Accordingly, the integrated circuit fabrication methods described herein provide for integrated circuits with variably spaced fin structures. Variable spacing of fin structures enables formation of both memory devices and logic devices on a semiconductor substrate. Specifically, memory devices requiring variably spaced fin structures may be formed simultaneously with the formation of uniformly spaced fin structures in logic areas and in NMOS portions of memory areas. As described herein, the variably spaced fin structures are provided with sub-lithographic dimensions through the use of a self-aligned quadruple patterning technique.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A method for fabricating an integrated circuit comprising:
in a semiconductor wafer comprising a semiconductor substrate, a lower mandrel layer overlying the semiconductor substrate, and an upper mandrel layer overlying the lower mandrel layer, forming in the upper mandrel layer a first upper mandrel having a first critical dimension and a second upper mandrel having a second critical dimension, wherein the first critical dimension is different than the second critical dimension;
forming upper sidewall spacers along sidewalls of the first upper mandrel while leaving the second upper mandrel without sidewall spacers, wherein forming upper sidewall spacers along sidewalls of the first upper mandrel comprises forming upper sidewall spacers along sidewalls of both the first and second upper mandrels and thereafter removing the upper sidewall spacers along sidewalls of the second upper mandrel;
removing the first upper mandrel from between the upper sidewall spacers;
transferring a pattern of the upper sidewall spacers and of the second upper mandrel into the lower mandrel layer to form first lower mandrels according to the pattern of the upper sidewall spacers and a second lower mandrel according to the pattern of the second upper mandrel; and
forming lower sidewall spacers along sidewalls of the first and second lower mandrels.

2. The method of claim 1, further comprising removing the first and second lower mandrels while leaving the lower sidewall spacers in place.

3. The method of claim 2, further comprising transferring a pattern of the lower sidewall spacers into the semiconductor substrate for forming a plurality of fins based on the pattern of the lower sidewall spacers.

4. The method of claim 3, wherein transferring the pattern of the lower sidewall spacers comprises transferring the pattern through a lower pattern transfer layer or a lower hardmask layer.

5. The method of claim 4, wherein forming the plurality of fins comprises forming fins having at least two different pitches.

6. The method of claim 5, further comprising forming a FinFET integrated circuit structure using the fins having at least two different pitches.

7. The method of claim 1, wherein removing the upper sidewall spacers along sidewalls of the second upper mandrel comprises masking the first upper mandrel and the sidewall spacers along sidewalls of the first upper mandrel.

8. The method of claim 1, wherein removing the first upper mandrel comprises masking the second upper mandrel.

9. The method of claim 1, transferring the pattern of the upper sidewall spacers and of the second upper mandrel comprises transferring the pattern through an upper pattern transfer layer or an upper hardmask layer.

10. A method for fabricating a FinFET integrated circuit comprising:
provding a semiconductor wafer comprising a semiconductor substrate, a lower mandrel layer overlying the semiconductor substrate, and an upper mandrel layer overlying the lower mandrel layer;
forming in the upper mandrel layer at a first area of the semiconductor wafer a first upper mandrel having a first critical dimension and at a second area of the semiconductor wafer a second upper mandrel having a second critical dimension, wherein the first critical dimension is different than the second critical dimension, and wherein the first area is separate and apart from the second area on the semiconductor wafer;
forming a first sidewall spacer forming layer over the first and second upper mandrels and along sidewalls of the first and second upper mandrels;
removing the first sidewall spacer forming layer from over both of the first and second upper mandrels and from along sidewalls of the second upper mandrel, wherein the first sidewall spacer forming layer along sidewalls of the first upper mandrel remain in place, thus forming upper sidewall spacers along sidewalls of the first upper mandrel;
removing the first upper mandrel from between the upper sidewall spacers while leaving the second upper mandrel in place;
transferring a pattern of the upper sidewall spacers and of the second upper mandrel into the lower mandrel layer to form first lower mandrels according to the pattern of the upper sidewall spacers and a second lower mandrel according to the pattern of the second upper mandrel;
forming a second sidewall spacer forming layer over the first and second lower mandrels and along sidewalls of the first and second lower mandrels;
removing the second sidewall spacer forming layer from over both of the first and second lower mandrels, thus forming lower sidewall spacers along sidewalls of the first and second lower mandrels;
removing the first and second lower mandrels while leaving the lower sidewall spacers in place;
transferring a pattern of the lower sidewall spacers into the semiconductor substrate for forming a plurality of fins based on the pattern of the lower sidewall spacers, wherein forming the plurality of fins comprises forming fins having at least two different pitches, wherein fins of a first pitch are in the first area and fins of a second pitch are in the second area; and
forming the FinFET integrated circuit structure using the fins having at least two different pitches.

11. The method of claim 10, wherein providing the semiconductor wafer comprises providing the semiconductor wafer comprising a bulk silicon or a silicon-on-insulator material as the semiconductor substrate.

12. The method of claim 10, wherein providing the semiconductor wafer comprises providing the semiconductor wafer comprising an amorphous silicon lower mandrel layer.

13. The method of claim 10, wherein providing the semiconductor wafer comprises providing the semiconductor wafer comprising a silicon nitride upper mandrel layer.

14. The method of claim 10, wherein forming the first sidewall spacer forming layer comprises forming a silicon oxide sidewall spacer forming layer.

15. The method of claim 10, wherein forming the second sidewall spacer forming layer comprises forming a silicon oxide sidewall spacer forming layer.

16. The method of claim 10, wherein providing the semiconductor wafer further comprises providing a semiconductor wafer with a capping layer overlying the upper mandrel layer.

17. The method of claim 16, wherein forming the first and second upper mandrels comprises etching through the capping layer using a patterned masking layer as an etch mask.

18. The method of claim 10, wherein forming the FinFET integrated circuit structure further comprises one or more of the following selected from the group consisting of: the formation of gates, source/drain regions, stress materials, contacts, and interconnect structures.

* * * * *